United States Patent
Mok et al.

(10) Patent No.: US 7,241,030 B2
(45) Date of Patent: *Jul. 10, 2007

(54) ILLUMINATION APPARATUS AND METHOD

(75) Inventors: Thye Linn Mok, Pinang (MY); Sundar Natarajan Yogananadan, Pinang (MY); Kian Shin Lee, Penang (MY); Kheng Leng Tan, Penang (MY); Siew It Pang, Penang (MY); Yew Cheong Kuan, Penang (MY); Norfidathul Aizar Abdul Karim, Penang (MY); Su Lin Oon, Penang (MY); Fakhrul Arifin Mohd Afif, Alam (MY); Wen Ya Ou, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 270 days.

This patent is subject to a terminal disclaimer.

(21) Appl. No.: 10/903,147

(22) Filed: Jul. 30, 2004

(65) Prior Publication Data
US 2006/0023448 A1   Feb. 2, 2006

(51) Int. Cl.
*F21V 29/00* (2006.01)
(52) U.S. Cl. .................. 362/294; 362/272; 362/373

(58) Field of Classification Search ................ 362/249, 362/294, 373, 271, 272
See application file for complete search history.

(56) References Cited

U.S. PATENT DOCUMENTS

| | | | |
|---|---|---|---|
| 6,045,240 A * | 4/2000 | Hochstein | 362/294 |
| 6,367,949 B1 * | 4/2002 | Pederson | 362/240 |
| 6,920,046 B2 * | 7/2005 | Spryshak | 361/704 |
| 6,999,318 B2 * | 2/2006 | Newby | 361/719 |
| 7,033,036 B2 * | 4/2006 | Pederson | 362/35 |
| 7,131,757 B2 * | 11/2006 | Menke | 362/542 |
| 2004/0190305 A1 * | 9/2004 | Arik et al. | 362/555 |

OTHER PUBLICATIONS

Tom Harris, "How Light Emitting Diodes Work", www.electronics.howstuffworks.com/led.htm, Jun. 18, 2004, 6 pages.
Joe Tawil, "Colorimetry", www.cameraguild.com/technology/colorimetry.htm, Jun. 21, 2004, 13 pages.
* cited by examiner

*Primary Examiner*—John Anthony Ward

(57) ABSTRACT

Illumination apparatus includes a support structure, at least one light emitting element, and a heat sink thermally coupled to the light emitting element. The light emitting element and heat sink are moveable in relation to the support structure. An actuator system moves the at least one light emitting element and the heat sink with respect to the support structure.

5 Claims, 3 Drawing Sheets

ILLUMINATION APPARATUS AND METHOD

BACKGROUND

Light emitting diodes, commonly called LEDs, are widely used in electronics today. LEDs perform many different functions in a wide variety of devices, including, among other things, numbers on digital clocks, illumination of traffic lights, transmitting information from remote controls, lighting up watches, and forming images on a television or computer screen. Placing LEDs in a dense formation generally results in more desirable uniform light output. Unfortunately, placing LEDs in a dense formation also undesirably increases the temperature of the LEDs, increasing the frequency of electrical problems. The tradeoff between the desirable uniform light output and the undesirable temperature increase is a common problem faced by those in the industry when designing LED arrays. The density of an LED array, and thus the quality of the light output, is directly limited by the heat dissipation around the LEDs.

SUMMARY OF THE INVENTION

The following summary is provided as a brief overview of the claimed apparatus and method. It shall not limit the invention in any respect, with a detailed and fully-enabling disclosure being set forth in the Detailed Description of Preferred Embodiments section below.

Illumination apparatus may comprise a support structure and at least one light emitting element. A heat sink is thermally coupled to the light emitting element. The light emitting element and heat sink are moveable with respect to the support structure. An actuator moves the light emitting element and heat sink with respect to the support structure.

Also disclosed is a method that comprises: mounting at least one light emitting element with a heat sink to a support structure so that the light emitting element and heat sink are moveable with respect to the support structure; and moving the light emitting element and heat sink with respect to the support structure.

DETAILED DESCRIPTION OF THE PREFERRED EMBODIMENTS

Figure 1:
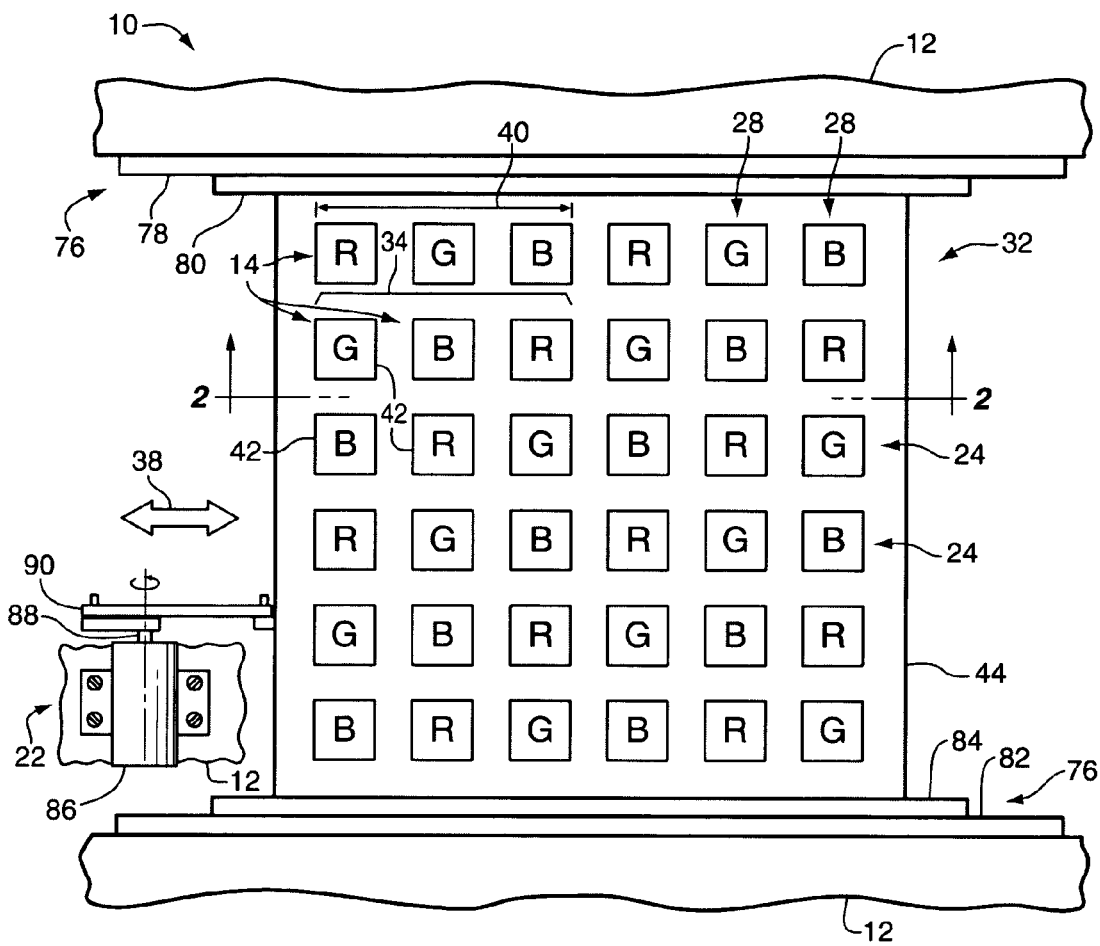
FIG. 1 is a top view of one embodiment of the illumination apparatus.
Figure 2:
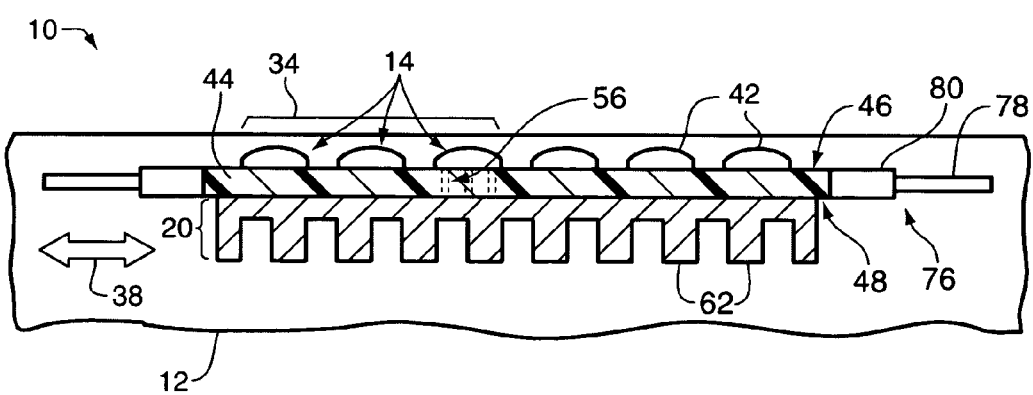
FIG. 2 is a cross-sectional view in elevation of the illumination apparatus taken along the line 2-2 of FIG. 1.

One embodiment of illumination apparatus 10 is best seen in FIGS. 1 and 2 and may comprise a support structure 12, at least one, and usually a plurality of light emitting elements 14, a heat sink 20, and an actuator system 22. The heat sink 20 is thermally coupled to the light emitting elements 14 and dissipates heat produced by the light emitting elements 14. The light emitting elements 14 and heat sink 20 are mounted so that they are moveable with respect to the support structure 12. In the embodiment shown and described herein, the light emitting elements 14 and heat sink 20 are moveable in one dimension (e.g., back and forth), generally in the directions indicated by arrows 38. The actuator system 22 is operatively associated with light emitting elements 14 and operates to move the light emitting elements 14 and heat sink 20 back and forth (i.e., generally in the direction indicated by arrows 38) with respect to support structure 12.

As will be described in greater detail below, the various light emitting elements 14 comprising the illumination apparatus 10 may be arranged in a plurality of rows 24 and columns 28 to form a two-dimensional array 32 of light emitting elements 14, although other arrangements are possible. In addition, in the embodiment shown and described herein, the various light emitting elements 14 comprise red (R), green (G), and blue (B) light emitting elements 14 which emit light that is about a color red, about a color green, and about a color blue respectively. The various colors of light emitting elements 14, e.g., the red (R), green (G), and blue (B) light emitting elements are arranged in a plurality of groups or triads 34, as best seen in FIG. 1.

In operation, the actuator system 22 rapidly moves the light emitting elements 14 and heat sink 20 with respect to the support structure 12. In the embodiment shown and described herein, the actuator system 22 moves the light emitting elements 14 and heat sink 20 in a reciprocating manner, i.e., back and forth in the directions indicated by arrows 38. If each of the different colors (e.g., red, green, and blue) of light emitting elements 14 are activated, the reciprocating movement of the light emitting elements 14 causes the light produced thereby to appear to the human eye to blend together. This blending together causes the human eye to perceive not the individual light emitting elements 14, but rather the additive combination or mixture of the light produced by the light emitting elements 14. Accordingly, in the example embodiment illustrated herein wherein the two-dimensional array 32 of light emitting elements 14 comprises light emitting elements 14 that emit about a color red, about a color green, and about a color blue, the two-dimensional array 32 of light emitting elements 14 will appear to the human eye to produce light that is substantially white in color, i.e., the additive combination of red, green, and blue light.

The ability to cause the two-dimensional array 32 to produce light that appears visually to be the additive combination of the light produced by the individual light emitting elements 14 is advantageous in a wide variety of applications, such as, for example, as in a white backlight for LCD displays. In addition, the reciprocating movement of the illumination apparatus 10 increases the air circulation around the heat sink 20, thereby improving the effectiveness (i.e., heat dissipation) of the heat sink 20. This enhanced heat dissipation provided by the moving heat sink 20 provides additional advantages. For example, higher-powered light emitting elements 14 may be used, or the density (i.e., number per unit area) of light emitting elements 14 may be increased. Alternatively, some combination of higher power and density may be used. In still another alternative, a smaller heat sink 20 may be used than would otherwise be the case.

Having briefly described one embodiment of illumination apparatus 10, its general operation, and some of its more significant features and attributes, various exemplary embodiments of the illumination apparatus 10 will now be described in detail.

With continuing reference to FIGS. 1 and 2, one embodiment of illumination apparatus 10 comprises at least one, and generally a plurality of light emitting elements 14. The light emitting elements 14 may be arranged in any of a wide range of configurations (e.g. circular, triangular, square, irregular, etc.) depending on the particular application and on the radiation or light output pattern of the particular type of light emitting elements 14. Consequently, the illumination apparatus 10 should not be regarded as limited to any particular arrangement or configuration of the light emitting elements 14. By way of example, in one embodiment, the light emitting elements 14 are arranged in a plurality of rows 24 and columns 28 to form a two-dimensional array 32 of light emitting elements 14. In the embodiment shown and described herein wherein it is desired that the two-dimensional array 32 of light emitting elements 14 appear to the human eye to generate white light, the various light emitting elements 14 comprise light emitting elements 14 that emit light that, when additively combined, will appear to the human eye as white light.

As is known, many different colors of light may be additively combined to produce light that appears white. In the embodiment shown and described herein, the light emitting elements 14 comprise various "colors" or types of light emitting elements 14 that emit light that is perceived as about a color red, about a color green, and about a color blue. The light emitting elements 14 that emit light that is about a color red are designated in FIG. 1 by the letter "R", whereas those that emit light that is about a color green are designated in FIG. 1 by the letter "G." Light emitting elements 14 that emit light that is about a color blue are designated in FIG. 1 by the letter "B."

The various red, green, and blue (i.e., R, G, and B) light emitting elements 14 are arranged in a plurality of triads 34, such that each triad 34 comprises a red (R) light emitting element 14, a green (G) light emitting element 14, and a blue (B) light emitting element 14. The various triads 34 may be arranged in a repeating manner, as illustrated in FIG. 1, although this is not required. Each of the triads 34 extends over a length 40. However, because many different colors of light may be additively combined to produce any desired color, including the "color" white, the present invention should not be regarded as limited to the particular red, green, and blue colors shown and described herein. In addition, greater or fewer numbers of individual colors may be used to produce the desired additive mixture, so the present invention should not be regarded as limited to the use of three separate colors.

Figure 3:
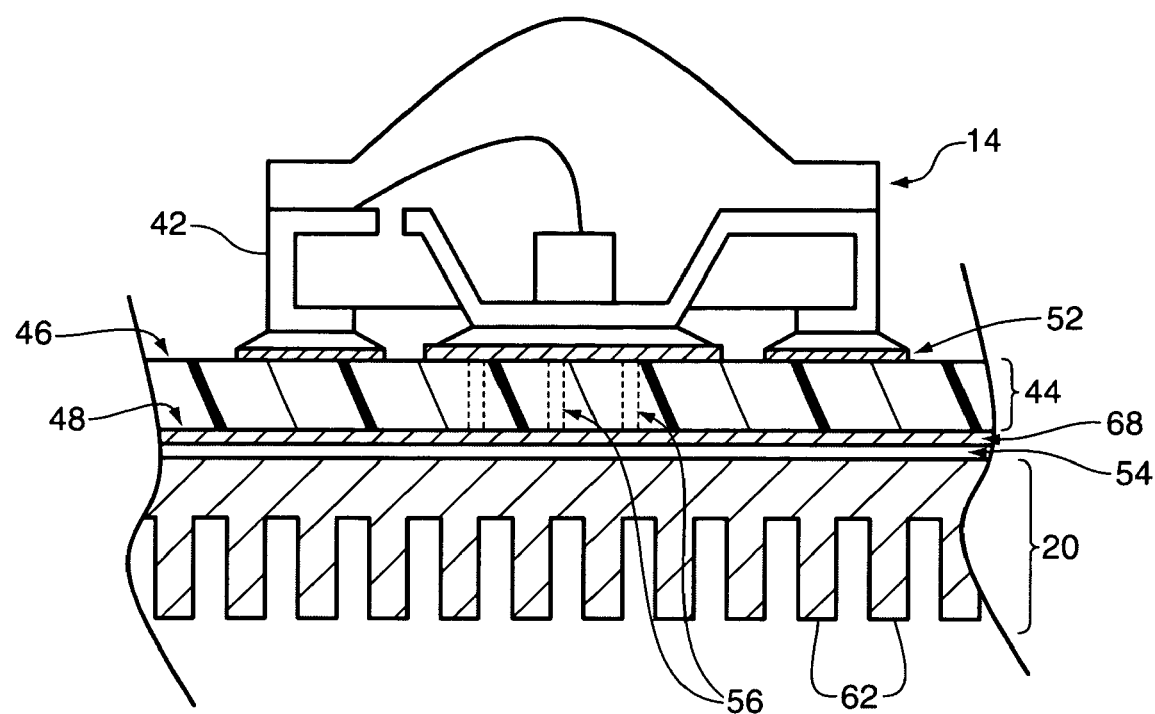
FIG. 3 is an enlarged cross-sectional view of a light emitting element.

With reference now to FIG. 3, each light emitting element 14 may comprise a light emitting diode (LED) 42 of the type well-known in the art and readily commercially available. Alternatively, other types of light emitting elements known in the art or that may be developed in the future may also be used. In the embodiment shown and described herein, the LED 42 may comprise a discrete, surface mount type of LED, although other types may also be used and should be regarded as within the scope of the present invention.

As already described, one embodiment of the illumination system 10 comprises three different types of LEDs 42. A first or red (R) LED 42 emits light that is perceived as about a color red, whereas a second type or green (G) LED 42 emits light that is perceived as about a color green. A third type or blue (B) LED 42 is also provided that emits light that is perceived as about a color blue. However, because LEDs 42 that emit light of various colors are well-known in the art and could be easily provided by persons having ordinary skill in the art, the particular LEDs 42 that may be utilized in one embodiment of the invention will not be described in further detail herein.

The light emitting elements 14, e.g., red (R), green (G) and blue (B) LEDs 42, may be mounted to a printed circuit board 44, as best seen in FIGS. 1-3. The printed circuit board 44 may comprise a generally planar, rectangularly-shaped structure having a first side 46 and a second side 48. Alternatively, other configurations are possible. The light emitting elements 14 may be mounted to the first side 46 of the printed circuit board 44, as best seen in FIGS. 2 and 3. The printed circuit board 44 may be provided with a variety of electrically conductive elements or traces, such as traces 52 and 68, which allow the various light emitting elements 14 to be electrically connected to each other and to suitable drive circuitry (not shown). The drive circuitry can then be used to activate or illuminate the various light emitting elements 14.

The heat sink 20 may comprise a generally rectangular configuration that is substantially co-extensive with the arrangement or pattern of light emitting elements 14 provided on the first side 46 of printed circuit board 44. The heat sink 20 may be provided with a number of elements, such as fins 62, which increase the surface area of the heat sink 20, thereby allowing the heat sink 20 to more efficiently dissipate heat. Alternatively, other types of elements, such as pins (not shown), that increase the surface area of the heat sink 20 may also be used. The heat sink 20 may be fabricated from any of a wide range of materials having a high thermal conductivity, such as copper, aluminum, and various alloys thereof. In addition, the number, type, and size of the elements (e.g., fins 62) that increase the heat-dissipating ability of the heat sink, will depend on the particular application and the amount of heat to be dissipated by the heat sink 20. However, in this regard it should be noted that the movement of the heat sink 20 tends to enhance the air circulation around the heat sink 20, thereby allowing smaller or a lesser number of fins 62 or pins (not shown) to be used than may otherwise be the case.

The heat sink 20 may be mounted to the second side 48 of the printed circuit board 44 in any convenient manner. In the embodiment shown and described herein, the heat sink 20 is secured or mounted to the second side 48 of the printed circuit board 44 by highly thermally conductive adhesive 54, such as T-Lam® from Thermagon Inc and Thermal Clad® from Bergquist. Alternatively, the heat sink 20 may be secured to the printed circuit board 44 by mechanical fasteners, such as by screws (not shown). If this type of mounting arrangement is used, the thermal resistance of the junction between the heat sink 20 and the printed circuit board 44 may be reduced by using a thermally conductive paste (not shown) of the type known in the art.

Depending on the amount of heat produced by the various light emitting elements 14, it may be desired, or even required, to provide the printed circuit board 44 with one or more heat pipes 56 to assist in the rapid conduction to the heat sink 20 of heat generated by the light emitting elements 14. The heat pipes 56 may comprise any of a wide variety of heat-conducting elements now known in the art or that may be developed in the future that are or would be suitable for conducting heat from the light emitting element 14 (mounted on the first side 46 of the printed circuit board 44) to the heat sink 20 (mounted on the second side 48 of the printed circuit board 44). By way of example, in one embodiment, the heat pipes 56 may comprise copper rods or plugs provided in through holes defined by the printed circuit board 44.

The printed circuit board 44 containing the light emitting elements 14 and heat sink 20 is mounted so that the assembly is moveable with respect to the support structure 12. In the embodiment shown and described herein, a mounting system 76 is used to mount the printed circuit board 44 to the support structure 12 so that the printed circuit board 44, along with the attached light emitting elements 14 and heat sink 20, are moveable in one dimension (e.g., back and forth), generally in the directions indicated by arrows 38. See FIGS. 1 and 2. Alternatively, the mounting system 76 may allow for other types of motion, such as motion in two dimensions (e.g., circular) or even in three dimensions. Consequently, the present invention should not be regarded as limited to any particular type of motion in any particular direction.

With reference now primarily to FIGS. 1 and 2, the mounting system 76 in one embodiment comprises a first track 78 mounted to the support structure 12 and a second track 80 mounted to the printed circuit board 44. The second track 80 slidably engages the first track 78 so that the printed circuit board 44 can be moved in one dimension (e.g., back and forth in the direction indicated by arrows 38) with respect to the support structure 12. A second set of tracks 82 and 84 may be provided on the opposite side of printed circuit board 44 to provide support for the opposite end of the printed circuit board 44. Alternatively, other types of mounting systems may be used, as would become apparent to persons having ordinary skill in the art after having become familiar with the teachings provided herein. The range of motion provided by the mounting system 76 should be about equal to the length 40 of a triad 34 and generally greater than the length 40 of a triad 34. Such a range of motion will provide a more effective blending or additive combination of the light produced by the three different colored light emitting elements 14 comprising a triad 34.

The illumination apparatus 10 is also provided with an actuator system 22 to move the light emitting elements 14 and heat sink 20 with respect to the support structure 12. In one embodiment, the actuator system 22 comprises a motor 86 mounted to the support structure 12 and is operatively connected to the printed circuit board 44. The motor 86 is provided with a drive system 90 that converts the rotation of motor shaft 88 to a linear movement suitable for moving the printed circuit board 44 in the reciprocating manner already described. Alternatively, other types of actuator systems, such as linear motors or piezoelectric actuators could also be used.

Regardless of the particular actuator system 22 that is utilized, the actuator system 22 should move (e.g., reciprocate) the printed circuit board 44 so that the light emitting elements 14 provided thereon are reciprocated by a distance that is about equal to the length 40 of a triad 34. In many applications it will be desirable to reciprocate the light emitting elements 14 by a distance that is somewhat greater than the length 40 of a triad 34 to ensure optimal blending or additive mixing of the various colors produced by the light emitting elements 14.

The frequency of the movement caused by the actuator system 22 may be selected so that it is sufficiently high to prevent the human eye from visually discerning the reciprocating movement of the light emitting elements 14. By way of example, in one embodiment, the light emitting elements 14 are reciprocated at a frequency of at least about 60 Hz, which is sufficient to prevent the human eye from visually discerning the movement of the light emitting elements 14.

In operation, illumination apparatus 10 may be utilized by moving (e.g., in a reciprocating manner indicated by arrows 38) the light emitting elements 14 and heat sink 20 with respect to the support structure 12. When the light emitting elements 14 are activated or illuminated, the movement of the light emitting elements 14 will cause a blending or additive mixing of the light produced by the light emitting elements 14. For example, in the embodiment shown and described herein wherein the light emitting elements 14 are arranged in triads 34 comprising red (R), green (G), and blue (B) light emitting elements 14, the motion will cause the red, green and blue lights to be blended or additively mixed together, causing the triad 34 to appear to the human eye to produce white light. Of course, any desired color may be produced in this manner. In addition, the movement of the heat sink 20 creates improved air circulation around the heat sink 20, thereby improving the heat dissipation of the heat sink 20.

Figure 4:
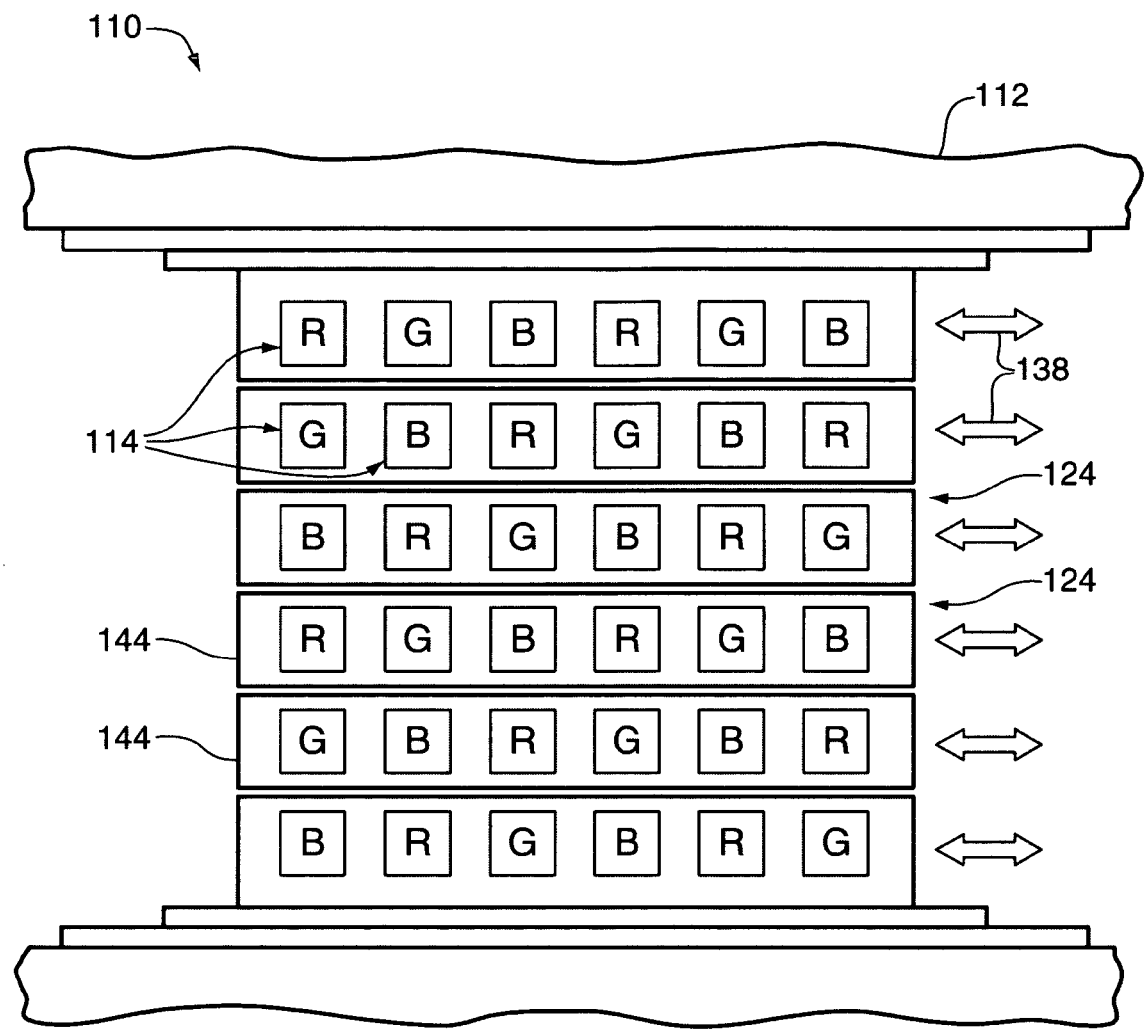
FIG. 4 is a top view of another embodiment of the illumination apparatus.

A second embodiment 110 of illumination apparatus is illustrated in FIG. 4. The second embodiment 110 is similar to the first embodiment 10 already described, except that each row 124 of light emitting elements 114 is separately moveable with respect to other rows 124 and to the support structure 112. Each row 124 of light emitting elements 114 may be mounted to an elongated printed circuit board 144, which is provided with its own heat sink (not shown) on the opposite or back side of the printed circuit board 144 in the manner already described for the first embodiment. Accordingly, each of the heat sinks (not shown) associated with each row 124 of light emitting elements 114 is independently moveable. A suitable mounting system (not shown) may be provided to allow each of the individual printed circuit boards 144 (and corresponding rows 124 of light emitting elements 114 and associated heat sinks) to be moved in one dimension (e.g., back and forth) in the directions indicated by arrows 138. Similarly, the second embodiment 110 may also be provided with an actuator system (not shown) suitable for independently moving the printed circuit boards 144.

Having herein set forth preferred embodiments of the present invention, it is anticipated that suitable modifications can be made thereto which will nonetheless remain within the scope of the invention. The invention shall therefore only be construed in accordance with the following claims.

What is claimed is:

1. An illumination apparatus, comprising:
   a support structure;
   at least one light emitting element;
   a heat sink thermally coupled to said at least one light emitting element, said at least one light emitting element and said heat sink being moveable in relation to said support structure;
   an actuator system operatively associated with said at least one light emitting element, said actuator system being configured to move said at least one light emitting element and said heat sink with respect to said support structure such that air flow is induced around said heat sink and thermal cooling thereof is effected;
   wherein said light emitting elements are arranged in a plurality of rows, and wherein said heat sink comprises a plurality of heat sinks mounted to said rows of light emitting diodes, said rows of light emitting elements and said heat sinks being independently moveable with respect to said support structure.

2. The apparatus of claim 1, wherein said actuator system comprises a motor and, a drive system operatively associ ated with said motor, said drive system converting rotational movement of a motor shaft to linear movement.

3. The illumination apparatus of claim 1, wherein said at least one light emitting element comprises a plurality of light emitting elements arranged in a plurality of triads, said plurality of triads being arranged in a repeating order in side by side relation to form a two-dimensional array of light emitting elements.

4. The illumination apparatus of claim 3, wherein each of said plurality of triads extends over a length, and wherein said actuator system moves said plurality of triads a distance of at least said length of said triad.

5. A method, comprising:
mounting at least one light emitting element with a heat sink to a support structure so that said at least one light emitting element and said heat sink are movable with respect to said support structure; and
moving said at least one light emitting element and said heat sink with regard to said support structure such that air flow is induced around said heat sink and thermal cooling thereof is effected;
wherein said moving step comprises linearly moving said at least one light emitting element and said heat sink with regard to said support structure.

* * * * *